(12) United States Patent
Molkow et al.

(10) Patent No.: US 9,919,601 B2
(45) Date of Patent: Mar. 20, 2018

(54) ELECTRONIC DEVICE AND OPERATING ASSEMBLY HAVING AN ELECTRONIC DEVICE

(71) Applicants: Leopold Kostal GmbH & Co. KG, Luedenscheid (DE); Bayerische Motoren Werke Aktiengesellschaft, Munich (DE)

(72) Inventors: Peter Molkow, Dortmund (DE); Karl Wilhelm Tenbrueggen, Dorsten (DE); Markus Brendel, Herne (DE); Guido Huperz, Olpe (DE); Michael Bleckmann, Schwerte (DE); Florian Miedl, Munich (DE); Thomas Tille, Munich (DE)

(73) Assignees: Leopold Kostal GmbH & Co. KG, Luedenscheid (DE); Bayerische Motoren Werke Aktiengesellschaft, Munich (DE)

( * ) Notice: Subject to any disclaimer, the term of this patent is extended or adjusted under 35 U.S.C. 154(b) by 1 day.

(21) Appl. No.: 15/262,119

(22) Filed: Sep. 12, 2016

(65) Prior Publication Data
US 2016/0375772 A1 Dec. 29, 2016

Related U.S. Application Data

(63) Continuation of application No. PCT/EP2015/055458, filed on Mar. 16, 2015.

(30) Foreign Application Priority Data

Mar. 18, 2014 (DE) .................. 10 2014 003 864

(51) Int. Cl.
*H05K 5/00* (2006.01)
*B60K 37/02* (2006.01)
*H03K 17/96* (2006.01)

(52) U.S. Cl.
CPC .......... *B60K 37/02* (2013.01); *H03K 17/962* (2013.01); *H05K 5/0013* (2013.01);
(Continued)

(58) Field of Classification Search
None
See application file for complete search history.

(56) References Cited

U.S. PATENT DOCUMENTS 5,917,165 A * 6/1999 Platt .................. H03K 17/962
200/511
7,232,973 B2 6/2007 Kaps et al.
(Continued)

FOREIGN PATENT DOCUMENTS

| DE | 102006039133 A1 | 3/2008 |
|---|---|---|
| EP | 1672797 A2 | 6/2006 |
| GB | 2426344 A | 11/2006 |

OTHER PUBLICATIONS

The International Bureau of WIPO, International Preliminary Report on Patentability for International Application No. PCT/EP2015/055458, dated Sep. 29, 2016.
(Continued)

*Primary Examiner* — Courtney Smith
*Assistant Examiner* — Rashen E Morrison
(74) *Attorney, Agent, or Firm* — Brooks Kushman P.C.

(57) ABSTRACT

An electronic device includes a housing, a conductive foil, an elastomer body, and a strip composed of a non-elastomeric plastic. The conductive foil is electrically connected to the housing and has a functional section situated outside of the housing. The functional section of the conductive foil has a front side bearing sensors and/or display elements and is installable to a control panel. The elastomer body and the strip are positioned between an outer side of the housing and a back side of the functional section of the conductive foil.

16 Claims, 1 Drawing Sheet

(52) U.S. Cl.
CPC .... *H05K 5/0017* (2013.01); *B60K 2350/1008* (2013.01); *H03K 2017/9602* (2013.01); *H03K 2217/96076* (2013.01)

(56) References Cited

U.S. PATENT DOCUMENTS

| | | | | |
|---|---|---|---|---|
| 7,525,063 | B2* | 4/2009 | Dorwarth | G06F 3/03547 200/17 R |
| 7,576,631 | B1* | 8/2009 | Bingle | E05B 81/76 340/5.54 |
| 8,922,979 | B2* | 12/2014 | Fluhrer | H03K 17/964 361/679.01 |
| 9,615,468 | B2* | 4/2017 | Moncrieff | H05K 5/0017 |
| 2006/0131159 | A1* | 6/2006 | Kaps | H03K 17/962 200/600 |
| 2007/0182718 | A1* | 8/2007 | Schoener | B60K 35/00 345/173 |
| 2009/0009491 | A1* | 1/2009 | Grivna | G06F 3/033 345/184 |
| 2011/0057899 | A1* | 3/2011 | Sleeman | G01L 1/146 345/174 |
| 2012/0106051 | A1* | 5/2012 | Fluhrer | H03K 17/964 361/679.01 |
| 2012/0314348 | A1* | 12/2012 | Moncrieff | H05K 5/0017 361/679.01 |
| 2014/0197150 | A1* | 7/2014 | Varhabhatla | F24C 7/082 219/419 |
| 2014/0203863 | A1* | 7/2014 | Gillespie | H03K 17/9622 327/517 |
| 2016/0124554 | A1* | 5/2016 | Lewis | G06F 3/044 345/174 |

OTHER PUBLICATIONS

European Patent Office, International Search Report for the corresponding International Application No. PCT/EP2015/055458 dated Aug. 21, 2015.

* cited by examiner

ELECTRONIC DEVICE AND OPERATING ASSEMBLY HAVING AN ELECTRONIC DEVICE

CROSS-REFERENCE TO RELATED APPLICATIONS

This application is a continuation of International Application No. PCT/EP2015/055458, published in German, with an International filing date of Mar. 16, 2015 which claims priority to DE 10 2014 003 864.5, filed Mar. 18, 2014, the disclosures of which are hereby incorporated in their entirety by reference herein.

TECHNICAL FIELD

The present invention relates to an electronic device having a housing and a conductive foil electrically connected to an electronics system within the housing, the conductive foil having a functional section which is situated outside the housing, bears sensors and/or display elements, and is provided for installation on the rear side of a control panel. The present invention further relates to an operating assembly having the electronic device and the control panel.

BACKGROUND

Operating assemblies of motor vehicles and electrical household appliances often have control panels with display and switching elements. In modern control panels, switching elements are often designed as non-contact capacitive touch sensors having conductive surfaces situated on the rear side of a flat control panel.

DE 10 2006 039 133 A1 describes an operating device having a capacitive sensor button(s). The sensor button is an electrically conductive sensor element having a sensor surface. The sensor surface rests against the rear side of an electrically insulating cover plate. A circuit board is situated at a distance from the cover plate. The sensor element extends from the cover plate to the circuit board. A light box is between the cover plate and the circuit board. Via the lightbox the sensor element is fixed in a predefined position on the rear side of the cover plate, in parallel and perpendicular to the cover plate.

This operating device is a part of a household appliance such as a washing machine or dishwasher. In such household appliances, it is generally not a problem or even advisable to manufacture an operating device with an integrated electronics system and to mechanically connect the circuit board bearing the electronics system to a control panel.

More problematic are devices in which an electronic unit is pre-installed in a module housing and sensors and/or display elements are to be mounted on a separate control panel to, for example, the dashboard of a motor vehicle.

In principle, flexible circuit carriers such as conductive foils or films may be provided in order to mount sensors and/or display elements on the rear side of a control panel. In known applications, conductive foils bearing capacitive sensor surfaces as flat strip conductor sections are glued directly behind a control panel or attached to the control panel by extrusion coating. The sensor surfaces and/or display elements must be contacted and connected to an associated evaluation electronics system. This often results in difficulties in installation, especially in limited installation space. In addition, only after final installation is it possible to check or examine the overall functionality. It is also disadvantageous that such an arrangement is difficult to uninstall or dismantle if required.

Sensor surfaces on a conductive foil may, in principle, be fastened to a control panel by mechanical pressing. For example, the conductive foil may be mechanically pressed against the control panel via an elastically attached or resiliently mounted housing. Complicated fixing by gluing or extrusion coating is therefore dispensed with.

In regards to mechanically pressing conductive foils to control panels, it is problematic that control panels, and in particular the rear sides of dashboards, often have curvatures, uneven areas, bumps, bulges, etc. As a result of a control panel having such surface distortions, it is difficult to uniformly press the functional section of a flexible conductive foil, especially a relatively wide flexible conductive foil, onto the control panel. In particular, when the conductive foil having the sensor surfaces does not lie close against the control panel the function of the capacitive sensors may be impaired. The sensitivity and functional reliability of capacitive sensors may be significantly reduced by air inclusions between the sensor elements and the control panel on account of the very low relative permittivity of air compared to plastic.

Also, for multi-part or flat display elements situated on the rear side of a transparent or semi-transparent control panel, it is advantageous when the display elements maintain a small, uniform distance from the rear side of the control panel in order to avoid interfering uneven brightness distributions or regionally unclear displays.

SUMMARY

An object is an electronic device having a housing and a conductive foil connected to the housing in which the conductive foil is attachable without gaps to a control panel, which may not be completely flat, in a cost-effective and technically simple matter.

Another object is an operating assembly having the electronic device and the control panel in which the conductive foil is attached without gaps to the control panel.

In carrying out at least one of the above and/or other objects, an electronic device is provided. The electronic device includes a housing, a conductive foil, an elastomer body, and a strip composed of a non-elastomeric plastic. The conductive foil is electrically connected to the housing. The conductive foil has a functional section situated outside of the housing. The functional section of the conductive foil has a front side bearing sensors and/or display elements and is installable to a control panel. The elastomer body and the strip are positioned between an outer side of the housing and a back side of the functional section of the conductive foil.

In an embodiment, the elastomer body is positioned between the outer side of the housing and the strip and the strip is positioned between the elastomer body and the back side of the functional section of the conductive foil.

In an embodiment, the strip is connected to the housing with the elastomer body being sandwiched between the outer side of the housing and the strip. The strip may include detent elements connected to the housing to connect the strip to the housing.

In an embodiment, the strip is connected to the housing and fastens the elastomer body to the outer side of the housing by clamping.

The outer side of the housing, the elastomer body, and the strip may have approximately equal lengths and widths. The outer side of the housing and main surfaces of the elastomer body and the strip may be situated approximately in parallel to one another.

The strip may have a plurality of fins formed by a plurality of notches arranged perpendicularly with respect to a direction of an extension of the strip.

The elastomer body may have a honeycomb structure with multiple recesses and/or the strip may be transparent.

The sensors borne on the front side of the functional section of the conductive foil may be capacitive sensor elements.

Further, in carrying out at least one of the above and/or other objects, an operating assembly is provided. The operating assembly includes the electronic device and the control panel with the front side the functional section of the conductive foil resting against the back side of the control panel.

An embodiment provides an electronic device. The electronic device includes a housing and a conductive foil (or conductor film). An electronics system is situated within the housing. The conductive foil is electrically connected to the electronics system situated within the housing. The conductive foil has a functional section (i.e., a partial surface of the conductive foil). The functional section of the conductive foil is located outside of the housing. The functional section of the conductive foil bears sensors such as capacitive sensor surfaces or pads and/or display elements. The functional section of the conductive foil is designed to be installed on a back (or rear side) of a control panel (or operating panel). The installation involves the front side of the functional section of the conductive foil mounting to the back side of the control panel.

The electronic device further includes an elastomer body. The elastomer body is composed of an elastomeric material. The electronic device further includes a strip. The strip is composed of a non-elastomeric material such as a non-elastomeric plastic. The elastomer body and the strip are arranged between an outer side of the housing and the back (or rear) side of the functional section of the conductive foil. The elastomer body and the strip interact or physically engage with one another such that the sensors and/or display elements of the functional section of the conductive foil lie against the back side of the control panel without intermediate space or gaps.

Another embodiment provides an operating assembly in which the electronic device (namely, the functional section of the conductive foil) is attached to the back side of the control panel.

In embodiments, the elastomer body and the strip are situated between an outer side of the housing and the back side of the functional section of the conductive foil. The elastomer body is between the outer side of the housing and the strip; and the strip is between the elastomer body and the back side of the functional section of the conductive foil.

The arrangement and interaction of the elastomer body and the strip provide a shape adaptation between the conductive foil and the control panel. The shape adaptation ensures that the conductive foil is uniformly pressed against the control panel at a small distance therefrom, largely independently of the surface quality of the control panel. The electronic device thereby functions reliably, even with a non-flat or uneven control panel, and thus may be pre-assembled and checked prior to fastening of the electronic device to the control panel.

In an embodiment, the strip has a comb-like structure. The strip includes multiple notches introduced in the transverse direction of the strip which cause the strip to have the comb-like structure. The arrangement made up of the strip and the conductive foil attached to the strip may thus be designed to be stable, and at the same time, resilient to torsion and bending. This in turn facilitates a close attachment of the conductive foil to the control panel.

In an embodiment, the strip is produced from a transparent material and the elastomer body has an arrangement of recesses. Lighting means which illuminate or backlight sensor fields or display elements on the conductive foil may thus be used within the housing, making them visible through a transparent or semitransparent control panel. The recesses in the elastomeric body may have a honeycomb design.

BRIEF DESCRIPTION OF THE DRAWINGS

Functional principles and an exemplary embodiment are explained in greater detail below with reference to the drawings, which show the following.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
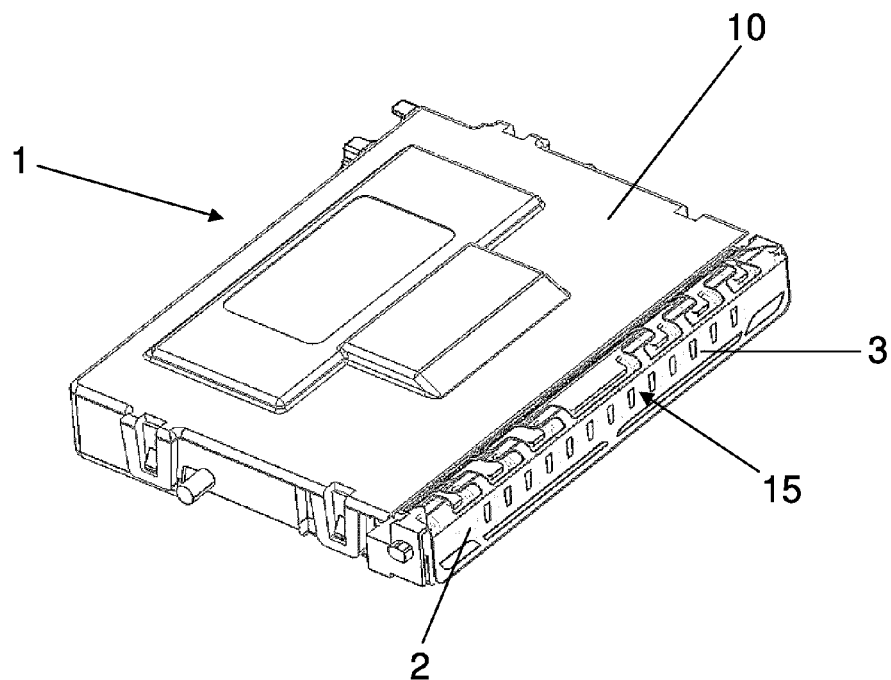
FIG. 1 illustrates a perspective view of an electronic device in accordance with the exemplary embodiment.

Referring now to FIG. 1, a perspective view of an electronic device 1 in accordance with an exemplary embodiment is shown. In the state illustrated in FIG. 1, electronic device 1 is pre-assembled but is not yet part of an operating assembly. Electronic device 1 includes a housing 10 and a flexible conductive foil (or conductor film) 2. Housing 10 has a box-like shape and contains therein an electronics system of electronic components (not shown). Conductive foil 2 is electrically connected to the electronics system contained within housing 10.

Conductive foil 2 has a partial section 3 situated along an outer side 5 of housing 10. Partial section 3 of conductive foil 2 at this location along outer side 5 of housing 10 forms a front face 15 of electronic device 1. Partial section 3 of conductive foil 2 is fitted, at least in sections, with electronic functional elements such as sensors (e.g., capacitive sensor surfaces or pads) and/or display elements. Hence, partial section 3 of conductive foil 2 is referred to herein as "functional section 3" of conductive foil 2.

Figure 2:
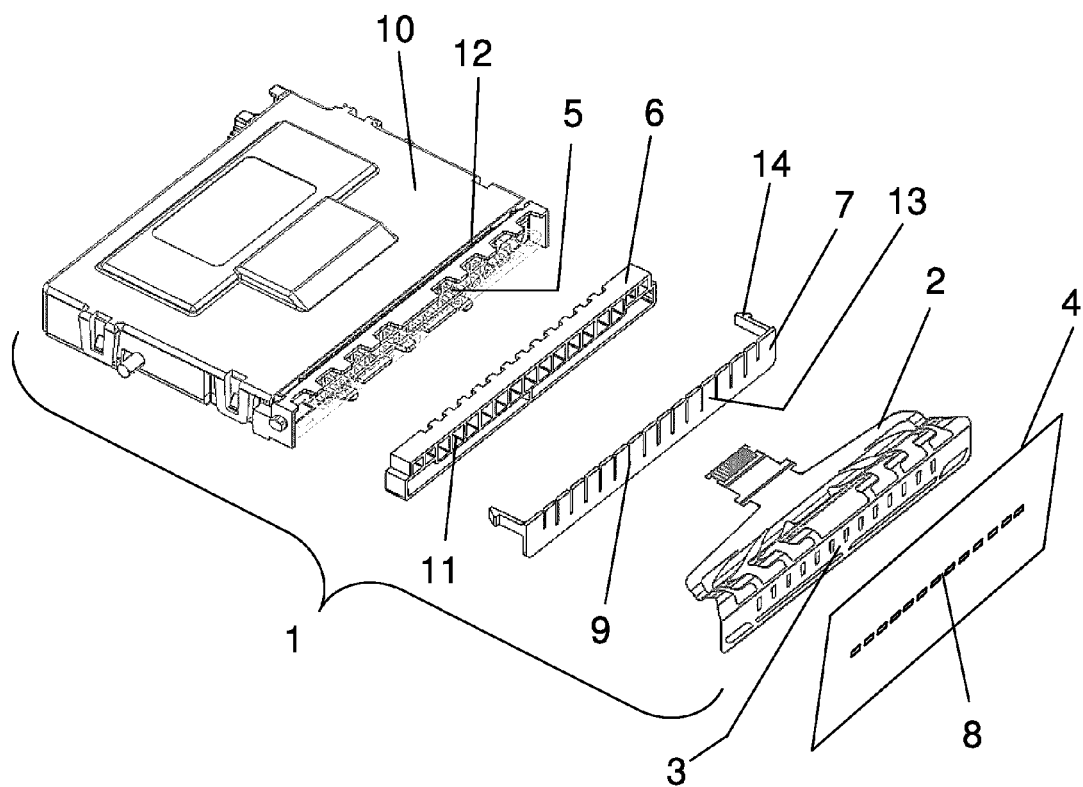
FIG. 2 illustrates an exploded view of an operating assembly having the electronic device.

Referring now to FIG. 2, with continual reference to FIG. 1, an exploded view of an operating assembly having electronic device 1 is shown. The operating assembly includes electronic device 1 and a control panel 4. Electronic device 1 and control panel 4 are mounted together to form the operating assembly. In particular, functional section 3 of conductive foil 2 (i.e., front face 15 of electronic device 1) is mounted on the back (or rear) side of control panel 4, resulting in the assembled operating assembly.

Control panel 4 is indicated in FIG. 2 as a two-dimensional surface for simplicity. Control panel 4 may be, for example, part of a household appliance or a partial section of the dashboard of a motor vehicle. The operating assembly results from the mechanical connection of electronic device 1 (shown in FIG. 1) to control panel 4. This mechanical connection includes the front side of functional section 3 of conductive foil 2, which faces away from outer side 5 of housing 10, being coupled (mounted, attached, or fastened) to the back side of control panel 4. The coupling takes place by pressing front face 15 of electronic device 1 against the back side of control panel 4. The pressing of front face 15 of electronic device 1 against the back side of control panel 4 may be carried out, for example, by spring elements (not shown) pressing electronic device 1 against control panel 4.

For proper functioning, functional section 3 of conductive foil 2 is to lie uniformly close against control panel 4 without spaces or gaps in between. Functional section 3 of conductive foil 2 lying uniformly close against control panel 4 without spaces or gaps in between is especially desired when functional section 3 of conductive foil 2 bears capacitive sensors. Such capacitive sensors are to be actuatable as switching elements by manually contacting functional contact surfaces 8 on the front side of control panel 4.

Control panels often do not have completely flat surfaces. The surface of a control panel may not be completely flat due to requirements for the attachment site or component tolerances. Attaching a large-surface functional section of a conductive foil to a control panel without spaces in between by simple pressing is therefore not easily achieved when the control panel is not completely flat. This is particularly true when, according to the exemplary embodiment, functional section 3 of conductive foil 2 to be attached to control panel 4 is narrow but relatively long.

Heretofore, attachment of a functional section of a conductive foil to an uneven control panel without spaces in between required use of special mechanical fastening means or fastening of the functional section of the conductive foil to the control panel by gluing. In any case, leveling out uneven areas of the control panel requires increased installation effort. In addition, in the case of gluing, it is difficult or impossible only by destroying the conductive foil to uninstall the functional section of the conductive foil from the control panel should this be desired.

Electronic device 1 is configured to enable functional section 3 of conductive foil 2 to be pressed against the back side of control panel 4 without spaces or gaps in between. In this regard, electronic device 1 further includes an elastomer body 6 and a strip 7. Elastomer body 6 is a strip-shaped body made of an elastomeric material. Strip 7 is a strip-shaped body made of a non-elastomeric material such as a non-elastomeric plastic. Elastomer body 6 and strip 7 are positioned between an outer side 5 of housing 10 and the back side of functional section 3 of conductive foil 2. In particular, elastomer body 6 is situated between outer side 5 of housing 10 and strip 7; and strip 7 is situated between elastomer body 6 and the back side of functional section 3 of conductive foil 2. Elastomer body 6 and strip 7 physically interact with one another and with housing 10 and control panel 4 such that functional section 3 of conductive foil 2 lies against the back side of control panel 4 without intermediate space or gaps in between.

Elastomer body 6, in contrast to the design illustrated in FIG. 2, may have a multi-part design. For example, elastomer body 6 may have multiple adjacently situated strip parts, each having a fairly short longitudinal extension. However, to simplify the description, elastomer body 6 is described here only in a one-part design without limiting generality.

Strip 7 includes detent elements 14 molded on its sides. Strip 7 is mechanically connected to housing 10 by detent elements 14. Strip 7 thus holds elastomer body 6 on housing 10 (i.e., elastomer body 6 is sandwiched between outer side 5 of housing 10 and strip 7). Elastomer body 6 is enclosed at its sides by a fastening collar 12 of housing 10. Fastening collar 12 is molded onto housing 10.

Elastomer body 6 is compressed by electronic device 1 toward control panel 4. The compression of elastomer body 6 toward control panel 4 generates a contact force acting on functional section 3 of conductive foil 2 via strip 7. Strip 7 thus fulfills the additional function of reinforcing and thus stabilizing functional section 3 of conductive foil 2. For this purpose, the rear side of functional section 3 of conductive foil 2 may be glued to strip 7.

Although strip 7 may be made of a solid, non-elastic material, strip 7 as a whole is flexible over its length as strip 7 is relatively thin. As a result of being flexible over its length, strip 7 is able to satisfactorily adapt its shape to control panel 4.

In the exemplary embodiment, strip 7 has a comb-like structure. Notches 9 introduced in the transverse direction along strip 7 form the comb-like structure. Notches 9 divide strip 7 into a plurality of contiguous fins (lamellae or slats) 13. In each case fins 13 are slightly deflectable relative to one another. Fins 13 thereby allow the shape of strip 7, and thus also the shape of functional section 3 of conductive foil 2 connected to strip 7, to be well adapted to the possibly uneven or curved shape of control panel 4.

The structuring of strip 7, in particular the amount of fins 13 formed by notches 9 introduced in strip 7, may be designed corresponding to the shape of control panel 4. A particularly uneven or strongly curved surface of control panel 4 may thus be leveled out by a sufficiently large selected amount of fins 13 or notches 9 introduced into strip 7.

Elastomer body 6 adapts over its length to the various possible deflections of fins 13. Elastomer body 6 thus provides for close pressing of functional section 3 of conductive foil 2, resting on strip 7, against the back side of control panel 4.

The use of strip 7 is also advantageous when conductive foil 2 is pre-assembled on strip 7 with relatively simple means such as by gluing. In contrast, fastening functional section 3 of conductive foil 2 to elastomer body 6 would require significantly greater effort.

This is particularly true when elastomer body 6 does not form a compact structure, and instead has a plurality of recesses 11 as in the exemplary embodiment. Through recesses 11 functional section 3 of conductive foil 2 and portions of control panel 4 may be backlit by lighting means (e.g., a LED(s)) situated in housing 10. Elastomer body 6 may thus have an approximately honeycomb-like structure. To allow backlighting of control panel 4, strip 7 and at least portions of functional section 3 have a transparent design. Accordingly, control panel 4 may also have a transparent or semitransparent design.

REFERENCE NUMERALS

1 Electronic device
2 Conductive foil
3 Functional section (partial surface) of the conductive foil
4 Control panel
5 Outer side of the housing
6 Elastomer body
7 Strip
8 Functional contact surface 9 Notches
10 Housing
11 Recesses
12 Fastening collar
13 Fins
14 Detent elements
15 Front face of the electronic device While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An electronic device comprising:
a housing;
a conductive foil electrically connected to the housing, the conductive foil having a functional section situated outside of the housing, the functional section of the conductive foil having a front side that bears sensors and/or display elements, and the front side of the functional section of the conductive foil being mountable to a control panel for the functional section of the conductive foil to be installable to the control panel;
an elastomer body;
a strip composed of a non-elastomeric plastic;
wherein the elastomer body is positioned between an outer side of the housing and the strip, and the strip is positioned between the elastomer body and a back side of the functional section of the conductive foil; and
wherein the strip is connected to the housing and fastens the elastomer body to the outer side of the housing in a clamping manner with the elastomer body being sandwiched between the outer side of the housing and the strip.

2. The electronic device of claim 1 wherein:
the strip includes detent elements connected to the housing to connect the strip to the housing.

3. The electronic device of claim 1 wherein:
the outer side of the housing, the elastomer body, and the strip have approximately equal lengths and widths.

4. The electronic device of claim 1 wherein:
the outer side of the housing and main surfaces of the elastomer body and the strip are situated approximately in parallel to one another.

5. The electronic device of claim 1 wherein:
the strip has a comb-like structure including a plurality of contiguous fins formed by a plurality of notches arranged perpendicularly with respect to a longitudinal extension of the strip, wherein the fins are deflectable relative to one another.

6. The electronic device of claim 1 wherein:
the elastomer body has a honeycomb structure with multiple recesses.

7. The electronic device of claim 1 wherein:
the strip is transparent.

8. The electronic device of claim 1 wherein:
the front side of the functional section of the conductive foil bears sensors in the form of capacitive sensor elements.

9. An operating assembly comprising:
an electronic device including
a housing;
a conductive foil electrically connected to the housing, the conductive foil having a functional section situated outside of the housing, the functional section of the conductive foil having a front side that bears sensors and/or display elements;
an elastomer body;
a strip composed of a non-elastomeric plastic;
wherein the elastomer body is positioned between an outer side of the housing and the strip, and the strip is positioned between the elastomer body and a back side of the functional section of the conductive foil; and
wherein the strip is connected to the housing and fastens the elastomer body to the outer side of the housing in a clamping manner with the elastomer body being sandwiched between the outer side of the housing and the strip;
a control panel; and
wherein the front side the functional section of the conductive foil rests against a back side of the control panel.

10. The operating assembly of claim 9 wherein:
the elastomer body and the strip physically engage with one another such that the sensors and/or display elements of the front side of the functional section of the conductive foil rests against the back side of the control panel without intermediate space or gaps.

11. The operating assembly of claim 9 wherein:
the strip has a comb-like structure including a plurality of contiguous fins formed by a plurality of notches arranged perpendicularly with respect to a longitudinal extension of the strip, wherein the fins are deflectable relative to one another.

12. The operating assembly of claim 9 wherein:
the elastomer body has a honeycomb structure with multiple recesses and the strip is transparent.

13. The operating assembly of claim 9 wherein:
the control panel is part of a dashboard of a motor vehicle.

14. The operating assembly of claim 9 wherein:
the operating assembly is part of a household appliance.

15. The operating assembly of claim 9 wherein:
the strip includes detent elements connected to the housing to connect the strip to the housing.

16. The operating assembly of claim 9 wherein:
the outer side of the housing, the elastomer body, and the strip have approximately equal lengths and widths.

* * * * *